United States Patent [19]

Ross et al.

[11] Patent Number: 5,311,446
[45] Date of Patent: May 10, 1994

[54] SIGNAL PROCESSING SYSTEM FOR SENSING A PERIODIC SIGNAL IN THE PRESENCE OF ANOTHER INTERFERING SIGNAL

[75] Inventors: Colin F. Ross, Stapleford, United Kingdom; Graham P. Eatwell, Caldecote, England

[73] Assignee: Active Noise and Vibration Technologies, Inc., Phoenix, Ariz.

[21] Appl. No.: 655,381
[22] PCT Filed: Aug. 10, 1989
[86] PCT No.: PCT/GB89/00913
§ 371 Date: Jul. 8, 1992
§ 102(e) Date: Jul. 8, 1992
[87] PCT Pub. No.: WO90/02447
PCT Pub. Date: Mar. 8, 1990
(Under 37 CFR 1.47)

[30] Foreign Application Priority Data

Aug. 17, 1988 [GB] United Kingdom ............... 8819581

[51] Int. Cl.$^5$ ..................... G01H 7/00; G06G 7/12
[52] U.S. Cl. ..................... 364/508; 364/551.01; 364/575; 340/825.210; 330/149
[58] Field of Search ............... 364/508, 551, 572, 574, 364/575, 724.01, 825

[56] References Cited

U.S. PATENT DOCUMENTS

| | | | |
|---|---|---|---|
| 3,900,823 | 8/1975 | Sokal et al. | 330/149 |
| 4,587,620 | 5/1986 | Niimi et al. | 364/574 |
| 4,694,415 | 9/1987 | Hasenkopf | 364/724 |
| 4,853,686 | 8/1989 | Kueng et al. | 340/825.210 |
| 4,926,361 | 5/1990 | Ohstubo et al. | 364/574 |
| 4,937,769 | 6/1990 | Verbanets | 364/574 |
| 4,947,356 | 8/1990 | Elliott et al. | 364/574 |
| 5,029,118 | 7/1991 | Nakajima et al. | 364/572 |
| 5,136,529 | 8/1992 | Makie et al. | 364/581 |
| 5,148,402 | 9/1992 | Magliozzi et al. | 364/574 |

Primary Examiner—Thomas G. Black
Assistant Examiner—Jacques H. Louis-Jacques
Attorney, Agent, or Firm—Lee, Mann, Smith, McWilliams, Sweeney, & Ohlson

[57] ABSTRACT

A signal processing system, especially for use in vibration control, wherein noise-free signals inductive of the timing of a primary source and of the timing of at least one interfering secondary source of periodic vibrations are provided as inputs, together with a vibration input signal derived from a sensor sampling the vibrations, and wherein the signals are processed to produce an output representative of interference free vibration of the primary source.

14 Claims, 4 Drawing Sheets

SIGNAL PROCESSING SYSTEM FOR SENSING A PERIODIC SIGNAL IN THE PRESENCE OF ANOTHER INTERFERING SIGNAL

FIELD OF THE INVENTION

This invention concerns a signal processing system which can be used to monitor one substantially periodic component where there is interference from one or more other substantially periodic components. Each component is usually associated with a particular vibration source. The system may be incorporated in an active control system for reducing noise and in the resulting control system, is normally used one per source of vibration.

The signal processing system has input signals which are time-related to each of the periodic sources. These additional inputs allow improved rejection of the vibration from other sources.

In this application the term vibration is used to mean any vibration, such as the vibration of solids and the vibration of fluids, normally referred to as sound or velocity perturbation.

BACKGROUND INFORMATION

There have been many attempts to achieve noise reduction by the use of active control and there are many publications relating to these previous systems. Most have dealt with the control of a single source of unwanted vibration, while others have treated multiple sources as a single, more complicated source. For example, in the control of cabin noise in propeller driven aircraft, the individual propellers are separate sources which are physically separate and, since the engine speeds are not identical, not completely coherent. However, previous methods to control aircraft cabin noise, have considered the vibrating cabin walls as a single, distributed source. Vide Warnaka, G. E. & Zalas, J. M. "Active Attenuation of noise in a closed structure." UK Patent 2,132,053: Groves, H. W. "Noise Suppression." UK Patent 2,126,837: Nelson, P. A. & Elliott, S. J. "Improvements in or relating to active noise reduction." UK Patent 2,149,614.

Most active control systems use a measure of the residual vibration at a point where reduction is desired to adjust the actuator drives vide Chaplin, G. "Active attenuation of recurring sounds." UK Patent 1,577,322. This measure will be corrupted by noise, due either to extraneous "background" vibration or to electronic noise. The level of this noise will limit the performance of the control system. If the source of vibration to be controlled is periodic, or almost periodic, in nature then the process of synchronous averaging can be used to reject noise which is not harmonically related to the vibration source. A signal from the vibration source is needed to synchronize the averaging process. This may be a signal from a tachometer or an applied voltage or similar. If the noise is random in nature then the ratio of the signal power to the noise power is increased in proportion to the number of averages. However, if the noise is from another periodic source of not identical speed, the noise to signal ratio is an oscillating function of the averaging time. Reference is made to FIG. A of the drawings, in which the envelope decays only slowly and scales with the best period of the two periodic sources. Conventional active control means then adopt one of two strategies.

The first is to average for a sufficiently long time, compared with the beat period, so that the envelope of the noise to signal ratio has decayed to a small enough value.

The second is to treat the vibration as if it were coming from a single source. This requires the system to adapt on a time-scale short compared with the beat period.

The first method cannot be used if the signal, that is the unwanted vibration, is not constant for long enough. The second method fails if the two fundamental frequencies drift apart producing a very rapid beating.

SUMMARY OF THE INVENTION

In a system incorporating the invention separation of the signal from the noise can be achieved by averaging for just the right period of time so that the noise to signal ratio is at, or close to, a zero.

The invention also lies in a signal processing means which achieves this separation, and which is characterized by having at least two inputs (rather than the single input of a conventional system), so that the system is supplied with information as to the timing of the secondary source or sources as well as the primary source.

An example of such a signal processing system incorporated in an active control system comprises a controller having as inputs, a signal $S_1$ which is time related to the vibration to be controlled, a signal $S_2$ which is time related to the vibration of a secondary source, and error signals which characterize the residual vibration, wherein the input signals are processed to produce output signals which are fed to an actuator system to produce a control vibration.

If the error signals $y(t)$ can each be considered as being composed of two sinusoidal components $y_1(t)$ and $y_2(t)$ having repeat periods $T_1$ and $T_2$, the task of the signal processor of the invention is first to determine the component $y_1(t)$. This is achieved by means of a transducer (e.g. a tachometer) associated with the source of the first vibration to give a measure of its period $T_1$. By sampling the signal $y(t)$ (=the combination of the two input signals) of the same point in every cycle of the primary vibration, it can be shown that if the two periods $T_1$ and $T_2$ are similar, the phase of the second component changes through 360° during $N = T_2/(T_1 - T_2)$ cycles.

If the average of N samples is taken, it thus approximates to $y_1(t)$ since the components introduced by $y_2(t)$ during that same N cycles will have effectively summed to zero.

Thus for the invention to be put into effect it is necessary for the processor to know the repeat period $T_2$ of the second component, so that the value of N for any given $T_1$ can be calculated, thus enabling the averaging period (number of samples, if one per cycle) to be determined.

The invention can thus handle any periodic signals since any such signal can be thought of as being composed of a sum of sinusoidal components of appropriate amplitude and phase.

The invention can also handle signals whose frequencies are slowly changing.

The invention can be stated as comprising signal processing means for sensing the vibration from a primary source of periodic vibration in the presence of interference from one or more secondary sources of periodic vibration, in which the signal processing means has a noise-free input from each source of periodic vibration which gives the signal processing means information about the timing of vibration, and a vibration input-signal that senses both primary and secondary vibration, further characterized in that the signal processing means produces an output determined from the inputs representative of the vibration from the primary source with a minimum of interference from the secondary source of sources.

A processing means embodying the invention uses the noise-free input from the primary source of vibration to set the time base for sampling the vibration signal.

The invention also envisages signal processing means in which the sampled vibration input signal is averaged over a number, M, of periods of the primary source of vibration and the number, M, is determined from the length of the primary and secondary vibration periods.

The invention also envisages a signal processing means in which different weighting is given to each set of samples of the vibration input signal taken in one period of the primary source of vibration.

Preferably the weighting is adjusted to minimize the noise amplification while maintaining the measurement of the primary vibration undistorted and maintaining the total rejection of the secondary vibration.

The weighting is conveniently adjusted to minimize jointly the noise amplification and the response to the secondary vibrations while maintaining the measurement of the primary vibrations undistorted.

The invention also lies in a vibration control system used to control the sound from a primary source of periodic vibration by driving actuators which introduce the controlling vibration, and sensors are provided which are responsive to the resultant controlled vibrations in combination with a signal processing means as aforesaid.

Two or more vibration control systems may be provided where each one is used to control the vibration from one of the sources of periodic vibration.

Such a vibration control system can provide an output or outputs equal to or representative of the current estimate of the residual primary vibration component of the vibration input signal or signals.

The input signals for such a vibration control system conveniently comprise (or are representative of) the current estimate of the residual secondary vibration component of the vibration input signal.

Two or more vibration control systems as aforesaid may be connected so that they exchange information about their estimates of the residual vibrations.

A vibration control system in accordance with the invention may also provide an output which indicates the phase of its adaption cycle.

A vibration control system in accordance with the invention may include an input which indicates the phase of adaption of other control systems operating upon or affecting the vibration input signals, and may use this input to synchronize its adaption cycle to minimize errors.

Two or more vibration control systems as aforesaid may be connected so that they exchange information about the adaption timing.

The invention also lies in the mounting of a vibration control system or systems according to the invention so as to reduce the internal noise in an enclosed space such as in an aircraft cabin or a machinery room of a ship.

The invention also lies in the mounting of a vibration control system or systems according to the invention so as to reduce the vibration produced by one or more sources mounted on a common structure for example in the propulsion system of a submarine or ship, or the fuselage of an aircraft.

The invention also lies in the mounting of a vibration control system or systems according to the invention so as to reduce the vibration produced by one or more sources connected in a ducting system for example where two fans pump air in series.

The invention may also be employed in signal processing means used to reduce the effect of an electrical supply mains induced interference.

BRIEF DESCRIPTION OF THE DRAWINGS

The invention will now be described by way of example with reference to the accompanying drawings, in which.

DESCRIPTION OF SYSTEMS EMBODYING THE INVENTION

Figure 2:
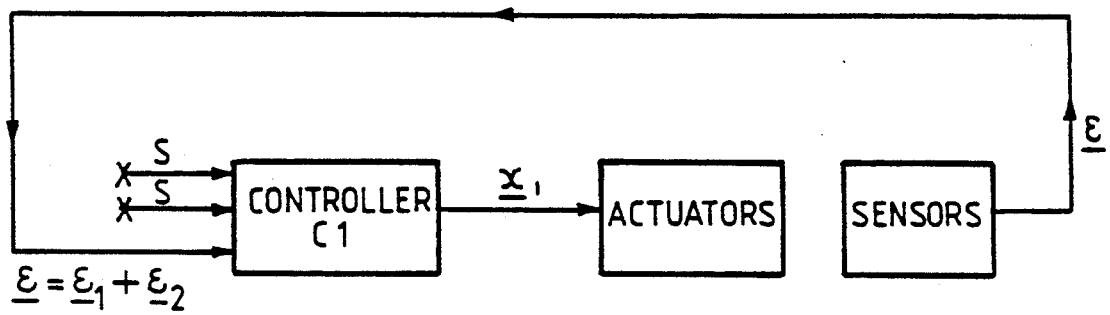
FIG. 2 shows a basic active noise control system incorporating a signal processing system in accordance with the invention.

An example of such a signal processing system incorporated in an active control system in FIG. 2. The controller, $C_1$, has, as inputs, signal $S_1$ which is time related to the vibration to the controlled, signal $S_2$ which is time related to the vibration of the secondary source, and signals which characterise the residual vibration. These input signals are processed to produce the output signals $X_1$ which are fed to the actuator system. The actuator system produces the control vibrations.

As a simple example of the signal processing used by the system we can consider a signal y(t) at time t which is composed of two sinusoidal components, $y_1(t)$ with amplitude A and repeat period $T_1$ and $y_2(t)$ with amplitude B and repeat period $T_2$. The signal is $$y(t) = A \sin(2\pi t/T_1) + B \sin(2\pi t/T_2)$$

Figure 1:
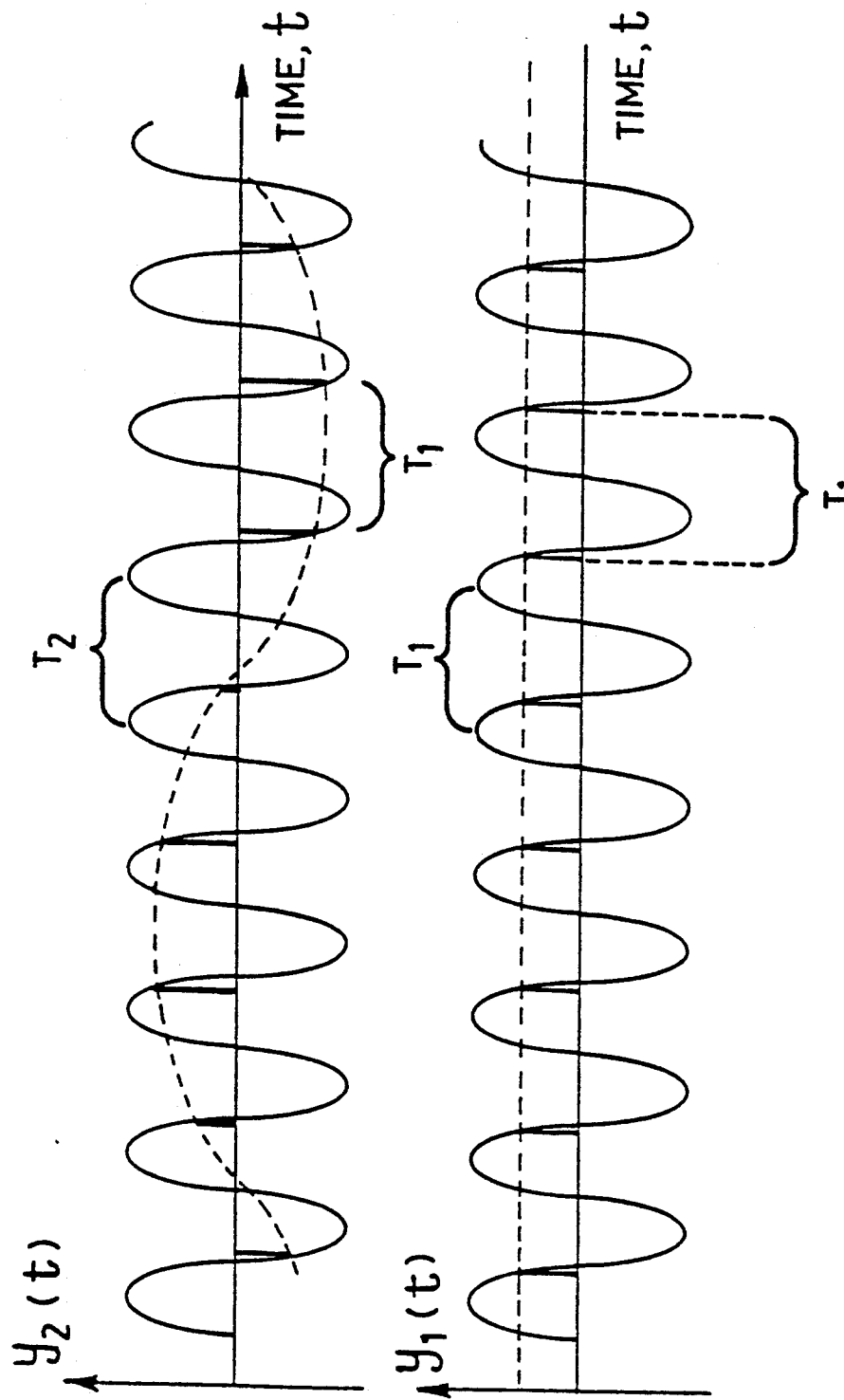
FIG. 1 shows how sampling components vary from cycle to cycle, when a composite signal is regularly sampled.
Figure 1A:
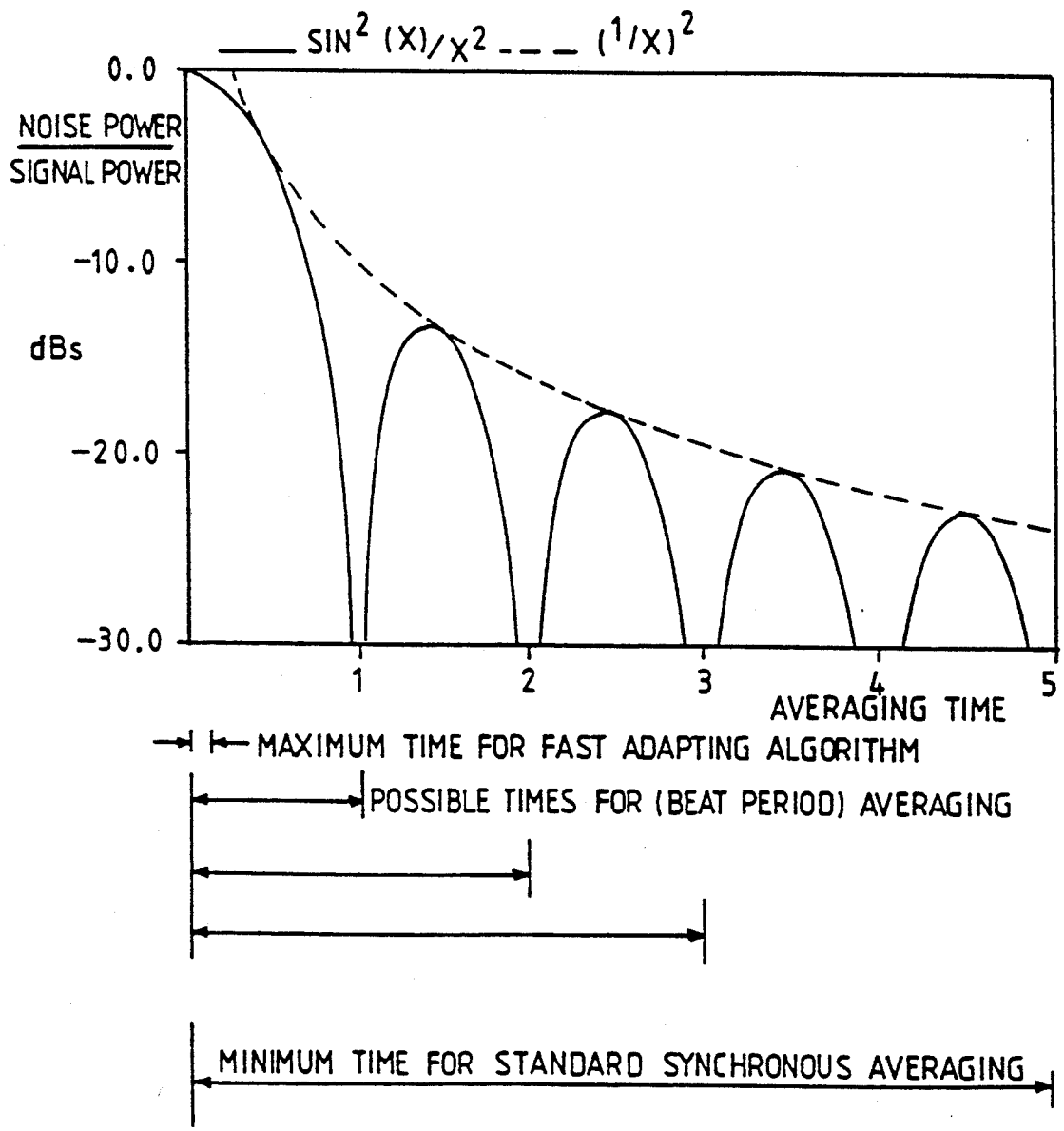
FIG. 1A shows a decaying noise envelope

The two components of the signal are shown in FIG. 1. The task of the signal processor is to determine the first component $y_1(t) = A \sin(2\pi t/T_1)$. One way of doing this is as follows: A tachometer or other sensor is connected to the source of the first vibration and provides a measurement of its period $T_1$. The signal processor examples the signal y(t) once every cycle. After n cycles the signal is $$y(t+nT_1) = A \sin(2\pi t/T_1 + 2n\pi) + B \sin(2\pi t/T_2 + 2n\pi(T_1-T_2)/T_2 + 2n\pi)$$

where we have used the identity $$T_1/T_2 = (T_1 - T_2 + T_2)/T_2$$
$$= (T_1 + T_2)/T_2 + 1$$

We can also use the identity $$\sin(x + 2n\pi) = \sin(x)$$

to give $$\begin{aligned} y(t + nT_1) &= A\sin(2\pi t/T_1) + \\ &\quad B\sin(2\pi t/T_2 + 2n\pi(T_1 - T_2)/T_2) \\ &= y_1(t) + y_2(t + n(T_1 + T_2)). \end{aligned}$$

Thus, the contribution from the first component is the same every sample, while the contribution from the second component varies from sample to sample. This is shown in FIG. 1. If the two frequencies are close together than $(T_1-T_2)/T_2$ is small. The phase of the second component changes by an amount $2\pi(T_1-T_2)/T_2$ radians between each sample, therefore when $N(T_1-T_2)/T_2 \approx 1$ the phase will have changed by $2\pi$ radians or 360°. This is after $N=T_2/(T_1-T_2)$ cycles or a time $$\begin{aligned} T_0 &= NT_1 = T_1T_2/(T_1 - T_2) \\ &= 1/(f_1 - f_2) \end{aligned}$$

which corresponds to half the 'beat' period of the two signals. If we take the average of the N samples we get $$\frac{1}{N} \sum_{n=1}^{N} y(t + nT_1) =$$

$$\frac{1}{N} \sum_{n=1}^{N} \{y_1(t) + y_2(t + n(T_1 + T_2))\} \approx y_1(t),$$

since the contributions from the second component tend to cancel each other out. Thus if we average over just the right number of samples we can obtain a good estimate of $y_1(t)$. In order to calculate thee right number the signal processor must known the repeat period, $T_2$, of the second component which it obtains from a second tachometer or sensor.

This method can be extended to cope with generally periodic signals since each can be thought of as being composed of a sum of sinusoidal components with the appropriate amplitude and phase. It can also be extended to cope with signals whose frequencies are slowly changing.

We will now explain how the signal processing system of the invention achieves its aim more generally by resorting to some mathematical analysis. Suppose the vibration to cancelled produces a signal $y(t)$ at time $t$ from one of the sensors. This signal is composed of a signals $y_1(t)$ due to the first source, $y_2(t)$ due to the secondary source and a noise component $n(t)$ due to background vibration and electrical noise.

In order to simplify the explanation that follows $y_1(t)$ and $y_2(t)$ are assumed to be periodic for the duration, $MT_1$, of the measurement so that $$y_1(t) = y_1(t + nT_1) \text{ for } 0 < n < M \tag{3.1}$$

$$y_2(t) = y_2(t + mT_2) \text{ for } 0 < mT_2 < MT_1 \tag{3.2}$$

where $T_2$ and $T_2$ are the periods of the signals $y_1$ and $y_2$ respectively. By the usual process of Fourier analysis the signal can be decomposed into harmonic components $$y_1(t) = \sum_{n=0}^{\infty} a_n \cos(2\pi nt/T_1) + \sum_{n=1}^{\infty} b_n \sin(2\pi nt/T_1) \tag{3.3}$$

and $$y_2(t) = \sum_{n=0}^{\infty} \alpha_n \cos(2\pi nT/T_2) + \sum_{n=1}^{\infty} \beta_n \sin(2\pi nt/T_2), \tag{3.4}$$

where $a_n$, $b_n$, $\alpha_n$ and $\beta_n$ are real coefficients.

The signal $y(t)$ is sampled in synchronism with a signal from the first source which has the period $T_1$. The M samples can be written as a vector $$Y = \{y(t), y(t+T_1), y(t+2T_1), \ldots y(t+(M-1)T_1)\} \tag{3.5}$$

We can introduce vectors associated with various harmonic components of the second source, namely $$c_n = \{\cos(2\pi nt/T_2), \cos(2\pi n(t+T_1)/T_2), \ldots, \tag{3.6}$$

$$\cos(2\pi n(t + (M-1)T_1)/T_2)\}^T$$

$$s_n = \{\sin(2\pi nt/T_2), \sin(2\pi n(t+T_1)/T_2), \ldots, \tag{3.7}$$

$$\sin(2\pi n(t + (M-1)T_1)/T_2)\}^T$$

Hence $$\underline{Y_2} = \sum_{n=0}^{\infty} \alpha_n c_n + \sum_{n=1}^{\infty} \beta_n s_n \tag{3.8}$$

we can set $\alpha_0 = 0$ without loss of generality.
Similarly we can write $$\underline{Y_1} = \sum_{n=0}^{\infty} a_n \cos(2\pi nt/T_1)\underline{u} + \sum_{n=1}^{\infty} b_n \sin(2\pi nt/T_1)\underline{u} \tag{3.9}$$

$$= y_1(t)\underline{u},$$

where $$\underline{u} = \{1, 1, \ldots 1\}^T \tag{3.10}$$

The signal processing system forms the linear combination of the signal samples $$y(t_k) = \sum_{q=0}^{Q-1} \sum_{m=0}^{M-1} W_m^{kq} y(t_q + mT_1) \tag{3.11}$$

where $t_q$ is the time of the k-th sample in the primary signal's period. Q is the number of samples in each period.

In the most straight forward case the signal processing system forms the average of the sampled signals $$y = \sum_{m=0}^{M-1} W_m y(t + mT_1) \tag{3.12}$$

$$= W^T Y$$

where $$\underline{W}^T = \{W_0, W_1, \ldots, W_{m-1}\} \tag{3.13}$$

The simplest approach is to set $$W = \frac{1}{M}\underline{u}$$

so that $$y = \underline{W}^T\underline{y}_1 + \underline{W}^T\underline{y}_2 + \underline{W}^T\underline{N} \quad (3.14)$$

$$= y_1(t) + \sum_{n=1}^{\infty}(\alpha_n\underline{W}^T\underline{c}_n + \beta_n\underline{W}^T\underline{s}_n) + \underline{W}^T\underline{N}$$

The form of $(W^Tc_n)^2$ is shown in FIG. A, as a function of the averaging time $MT_1$ while $$<(\underline{W}^T\underline{N})^2> \approx \frac{1}{M}<\underline{N}^T\underline{N}> \quad (3.15)$$

For example $$\underline{W}^T\underline{c}_n = \sum_{m=0}^{M-1} W_m \cos(2\pi nmT_1/T_2 + 2\pi nt_0/T_2)$$

$$= \frac{1}{M}\sum_{m=0}^{M-1} \cos(2\pi nm(T_1-T_2)/T_2 + 2\pi nt_0/T_2)$$

When the periods $T_1$ and $T_2$ are similar the cosine is a slowly varying function of m and the summation can be approximated by an integral. In particular $$\underline{W}^T\underline{c}_n \approx \frac{1}{T}\int_0^T \cos(2\pi nt/T_2 + 2\pi nt_0/T_2)dt \quad (3.16)$$

where $T = (M-1)(T_1-T_2)$ $$\underline{W}^T\underline{c}_n \approx \sin(n\pi T/T_2 + 2\pi nt_0/T_2)\frac{\sin(n\pi T/T_2)}{n\pi T/T_2} \quad (3.17)$$

Similarly $$\underline{W}^T\underline{s}_n \approx \cos(n\pi T/T_2 + 2\pi nt_0/T_2)\frac{\sin(n\pi T/T_2)}{n\pi T/T_2} \quad (3.18)$$

Therefore $\underline{W}^T\underline{c}_n$ and $\underline{W}^T\underline{s}_n$ are all zero when $$T/T_2 = k, \text{ ie } M - 1 = \left[\frac{kT_2}{T_1-T_2}\right], k = 1, 2, 3, \ldots \quad (3.19)$$

The factor $$\frac{T_2}{T_1-T_2}$$

is unlikely to be an integer so that the square brackets denote that the closest integer value should be taken.

We can now see that when the system averages the input signals for M periods the other signal would be rejected since $\underline{W}^T\underline{c}$ and $\underline{W}^T\underline{s}$ are then both zero.

The factor $$(\underline{W}^T\underline{s}_1)^2 + (\underline{W}^T\underline{c}_1)^2 = \left(\frac{\sin(\pi T/T_2)}{\pi T/T_2}\right)^2$$

is plotted as a function of $T/T_2$ in FIG. A; the envelope, given by $$\left(\frac{1}{\pi T/T_2}\right)^2,$$

is also shown.

One way of finding the appropriate time for averaging is to generate the discrete functions $c_1$ and $s_1$ and average these until both averages are zero or change sign together. Alternatively the system could look at alternate zero crossings of the average of $c_1$ or $s_1$. There are a variety of ways of finding the appropriate average time.

A control system can also be applied to the secondary source or sources. In order to discriminate against the vibration due to the first source (and the first control system) it too will require a second input to enable it to average for the appropriate number of cycles. The sensors and actuators could be common to both systems.

Figure 3:
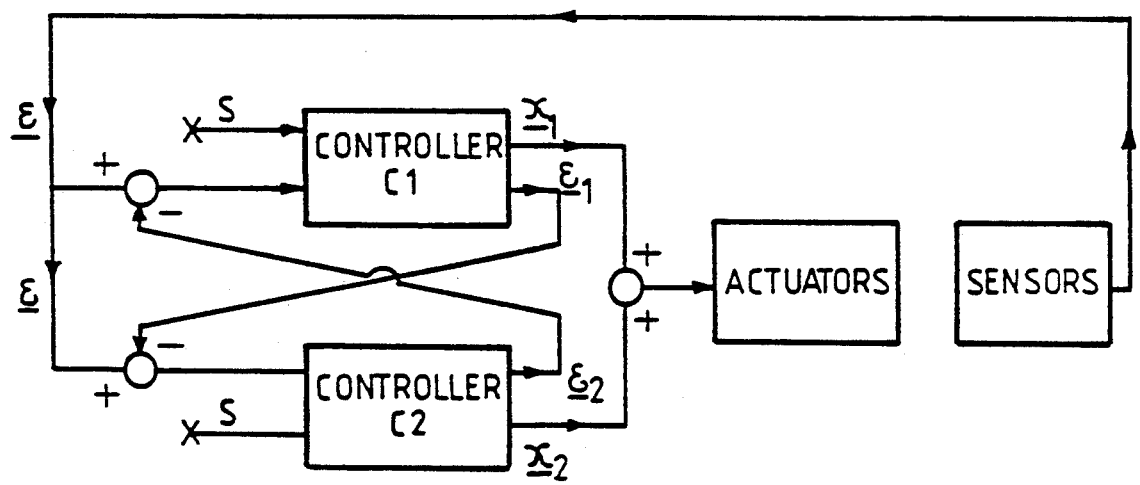
FIG. 3 shows how by using two controllers so different components can be isolated from the composite signal to drive actuators.

In practice the signal received from the sensor will be composed of components due to the sources and to noise and also to the control vibrations produced by the actuators. Thus, for each controller, the averaging process described above will produce an estimate of the signals due to any uncontrolled vibration from the corresponding source. These estimates could converted to analogue form and subtracted from the inputs to the other controller, either before or after digital sampling. This process requires the provision of two sets of Digital to Analogue Converters (D.A.C's) for each controller. One set produces actuator drive signals, $x_1$, the other set produces the estimated signal $\epsilon_1$, due to the uncontrolled vibration from one source. An example of such a system for controlling two sources is shown in FIG. 3.

This process has the potential of reducing the component of periodic noise and thus permitting greater reduction of the background noise. Care must be taken, however, that the estimates are accurate enough to avoid an unstable accumulation of errors.

Just such an accumulation occurs when the two periods are identical, but it may be tolerated if the periods are continually changing.

An example of the use of this approach is the control of sound in the cabin of a propeller driven aircraft. The propellers are usually desynchronized but the fundamental frequencies of the blade passing are usually separated by less than a few Hertz. This means that a conventional system would need to average for many seconds to separate out the two fundamental tones or would need to adapt many times a second to control the higher harmonics.

A system using the method of this invention could comprise a sensor, such as a tachometer, on each propeller or engine to give its position in the cycle, a set of microphones and a set of loudspeakers inside the cabin and two control systems as shown in FIG. 3. Each control system sends out signals in synchrony with the primary tachometer input and adjusts those signals, or the way in which they are determined, on the basis of signals obtained from the microphone array. The signals from the microphones are synchronously averaged for a time determined by the two tachometer signals.

Further information, such as the times when changes to the output signals are made, may be passed between the systems to improve the adaption.

If the noise is Gaussian, with power $n^2$, then the expected value of the square of the processed signal is $$<y^2> = y_1^2(t) + (\underline{W}^T\underline{W})^{\frac{1}{2}}n^2 \quad (3.20)$$

$$= y_1^2(t) + n^2/M$$

so the signal to noise ratio increases with the number of averages.

Figure 4:
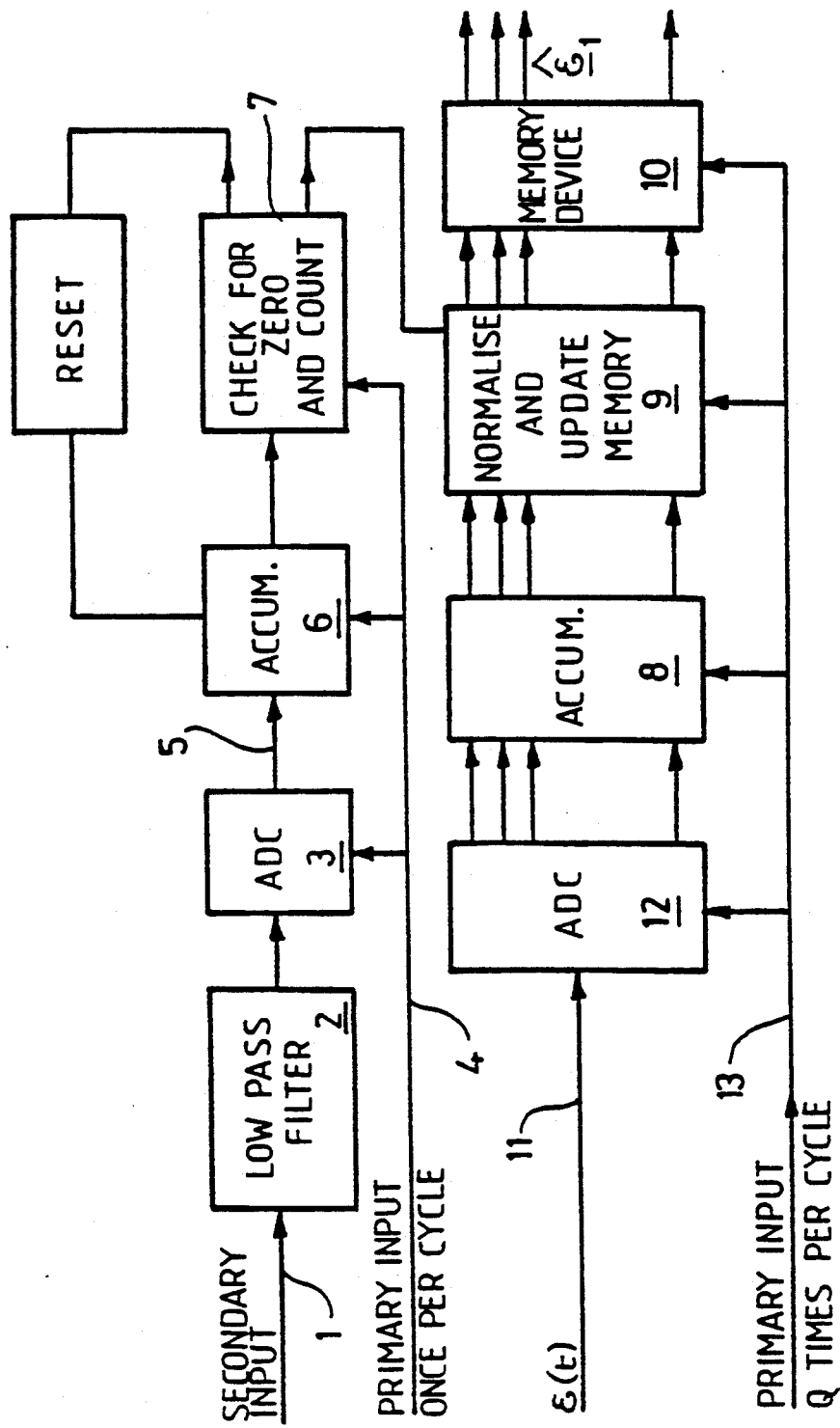
FIG. 4 is an example of a signal processing system embodying the invention.

An example of this signal processing system is shown in FIG. 4. The noise-free signal (1) from the secondary source is passed through a low-pass filter (2) and then sampled by an Analogue to Digital Converter (ADC) (3). This ADC is triggered by the noise-free signal (4) from the primary source. The output (5) from the ADC is a linear combination of $s_1$ and $c_1$. This output is summed in an accumulator (6). A computer (7) counts the number of accumulations and checks for sign changes in the accumulation. At the second sign change it resets the accumulator (6) to zero, takes the outputs of the accumulator (8), divides each output by the number of accumulations (9) and copies the results to a memory device (10). The vibration input signal (11) is sampled by an ADC (12) which is triggered Q times per cycle by the noise-free primary input (13). This produces Q outputs per cycle which are separately summed by the accumulator (8). The memory device (10) could feed a Digital to Analogue Converter, triggered by the primary noise-free input (13), so that a continuous estimate of the primary vibration signal is available.

There is no reason however that a uniformly weighted average needs to be employed. In fact, a non-uniform weighting may be essential if the frequencies are changing significantly on the scale of a beat period. In this case the vectors $s_n$ and $c_n$ again contain sine and cosine terms, but the phases are determined from the phase differences between the two trigger signals.

In fact discrimination against the second source can be achieved in a shorter time if a non-uniform weighting is used. We will now describe, in mathematical terms, one way to calculate the non-uniform weighting. We notice however that the contribution from Gaussian noise is multiplied by the factor $(\underline{W}^T\underline{W})^{\frac{1}{2}}$. We therefore require that $$\underline{W}^T\underline{c}_1 = \underline{W}^T\underline{s}_1 = 0, \quad \underline{W}^T\underline{u} = 1$$

and that $\underline{W}^T\underline{W}$ is as small as possible.

Hence we seek to minimise $$E = \tfrac{1}{2}\underline{W}^T\underline{W} + (\underline{W}^T\underline{C} - \underline{F}^T)\lambda \quad (3.21)$$

where

C is the matrix formed by the column vectors $(\underline{u}, \underline{c}_1, \underline{c}_2 \ldots, \underline{c}_l, \underline{s}_l)$. l, which must be less than half the number of samples, Q, is the number of harmonics to be discriminated against.

F is the column vector $\{1,0,0,\ldots,0\}^T$ which contains 2l zeros. $\lambda$ is a vector of Lagrange multipliers. The weighting vector $\underline{W}$ which minimizes $\underline{W}^T\underline{W}$ subject to the constraint $\underline{W}^T C = \underline{F}^T$ is $$\underline{W} = C(C^T C)^{-1}\underline{F} \quad (3.22)$$

The minimum value is
$$\underline{W}^T\underline{W} = \underline{F}^T(C^T C)^{-1}\underline{F} \quad (3.23)$$

which is the top left-hand element of $(C^T C)^{-1}$. This gives the amplification of the noise. If the two source periods are very close together then $(C^T C)$ may be ill-conditioned and noise amplification unacceptably large.

Instead we could minimise the level of the noise contamination and the other signal contamination, this would be done by minimizing $$E_1 = \tfrac{1}{2}\mu \underline{W}^T DD^T \underline{W} + \tfrac{1}{2}\underline{W}^T\underline{W} + \lambda(\underline{W}^T\underline{u} - 1) \quad (3.24)$$

where D is the matrix $(\underline{c}_1, \underline{s}_1, \underline{c}_2, \underline{s}_2, \ldots \underline{c}_l, \underline{s}_l)$ and $\lambda$ is a Lagrange multiplier. The constant $\mu$ represents the relative importance of the background noise and the secondary periodic noise term.

The weight vector which minimizes $E_1$ is $$\underline{W} = \frac{(DD^T + \mu I)^{-1}\underline{u}}{\underline{u}^T(DD^T + \mu I)^{-1}\underline{u}}, \quad (3.25)$$

where I is the identity matrix

An example of this processing system is shown in FIG. 5. the noise-free inputs (1) and (2) from the primary and secondary sources are fed to a TTL pulse generator which produces a once-per-cycle pulse for the secondary source (4) and both once-per-cycle and Q-times per cycle pulses for the primary source (5). The time between each once-per-cycle pulse is measured using an internal clock pulse (6) to give the periods $T_1$ and the $T_2$ of the primary and secondary vibrations. These are fed to a microprocessor (7) which calculates the weight vectors given by (3.21) or (3.24). These can be calculated directly or recursively. These weights are then stored in a memory device (8). The once-per-cycle pulse and the Q-times per-cycle pulse from the primary source (5) are used to trigger an Analogue to Digital Converter (9) which samples the vibration input signal $\epsilon(t)$ (10). These samples are stored in a memory device (11), which may be a first-in first-out device for example. These samples are then multiplied by the appropriate weights at (12) and summed in an accumulator (13) to give an estimate of that part of the vibration input signal that is due to the primary source. After the appropriate number of accumulations determined by a counter (14) the accumulator is reset to zero.

If the two periodic vibrations contain higher harmonics of the fundamental frequency then it is possible that the n-th harmonic of one is very close to the m-th harmonic of the other. The difference in frequencies of these two, or any two harmonics can be used to determine the optimal time for averaging.

It is claimed:

1. A method of monitoring a first substantially periodic signal component of a compound signal which includes a second substantially periodic signal component, wherein the first and second signal components have separate sources, comprising the steps of:
    (a) sensing the first and second signal components respectively;
    (b) determining a beat period as a function of the sensed first and second signal components;
    (c) sampling the compound signal in synchronism with the first signal component; and
    (d) averaging the compound signal samples over a period determined by said beat period to produce a contribution signal as a function of a contribution made to the compound signal by the first signal.

2. A method according to claim 1, wherein the beat period is defined by the product of the periods of the first and second signal components divided by the magnitude of the difference between the periods of the first and second signal components.

3. A method of at least partially cancelling a compound signal including a first substantially periodic signal component and a second substantially periodic signal component, wherein the first and second signal components have separate sources, including the steps of:

(a) Monitoring the first signal component by performing the steps:
  (i) sensing the first and second signal components respectively;
  (ii) determining a beat period as a function of the sensed first and second signal components;
  (iii) sampling the compound signal in synchronism with the first signal component; and
  (iv) averaging the compound signal samples over a period determined by said beat period to produce a contribution signal as a function of a contribution made to the compound signal by the first signal; and
(b) generating a cancelling signal to cancel the first signal component of the compound signal in dependence on said contribution signal.

4. A method according to claim 3, including the additional steps of:
(a) monitoring the second signal component by performing the steps:
  (i) sensing the first and second signal components respectively;
  (ii) determining a beat period as a function of the sensed first and second signal components;
  (iii) sampling the compound signal in synchronism with the first signal component; and
  (iv) averaging the compound signal samples over a period determined by said beat period to produce a contribution signal as a function of the contribution made to the compound signal by the first signal,
  as if the first signal component were the second signal component and the second signal component were the first signal component; and
(b) generating a cancelling signal for cancelling the second signal component of the compound signal in dependence on said contribution signal produced as a function of the contribution made to the compound signal by the second signal.

5. An apparatus for monitoring a first substantially periodic signal component of a compound signal which includes a second substantially periodic signal, wherein the first and second signal components have separate sources, comprising:
first sensor means for sensing the first signal component before it becomes combined in the compound signal, said first sensor means having an output;
second sensor means for sensing the second signal component before it becomes combined in the compound signal, said second sensor means having an output;
third sensor means for sensing the compound signal, said third sensor means having an output;
means for producing a controlling signal as a function of the output from the first and second sensor means;
sampling means arranged to sample the output from the third sensor means in synchronism with the output of the first sampling means; and
accumulator means for accumulating the compound signal samples over a period determined by the controlling signal to produce a contribution signal as a function of the contribution made to the compound signal made by the first signal component.

6. An apparatus according to claim 5, wherein the accumulator means is included in an averaging means.

7. An apparatus according to claim 5, wherein the means for producing a controlling signal includes a further sampling means for sampling the output of the second sensor means, said further sampling means having an output, an accumulator for accumulating the output of the further sampling means, said accumulator having an output, and a control circuit arranged to detect every second zero crossing in the output of the accumulator to produce an accumulator reset signal to reset the accumulator and the controlling signal.

8. An apparatus according to claim 5, wherein the means for producing a controlling signal comprises a microprocessor programmed to calculate a beat period from a signal representing the period of the outputs of the first and second sensing means.

9. An active noise cancelling apparatus including: an apparatus according to claim 6;
processing means for producing a cancelling signal as a function of the contribution signal; and
actuator means for producing cancelling vibrations in dependence on the cancelling signal.

10. An apparatus including first and second apparatuses according to claim 6, wherein the first signal component of the first apparatus is treated as the second signal component by the second apparatus and the second signal component of the first apparatus is treated as the first signal component by the second apparatus.

11. An apparatus according to claim 10, wherein the processing means carry out respective adaptive processes and include means for transferring adaptive timing information therebetween to effect synchronization of their respective adaptive processes.

12. An apparatus according to claim 9, mounted to reduce the noise in an enclosed space.

13. An apparatus according to claim 9, mounted to reduce vibration produced by a plurality of sources of vibration on a common structure.

14. An apparatus according to claim 9, mounted to reduce vibration produced by a plurality of sources of vibration in a ducting system.

* * * * *